(12) United States Patent
Cheng et al.

(10) Patent No.: US 9,617,143 B2
(45) Date of Patent: *Apr. 11, 2017

(54) SEMICONDUCTOR DEVICE

(71) Applicant: TAIWAN SEMICONDUCTOR MANUFACTURING COMPANY, LTD., Hsunchu (TW)

(72) Inventors: Chun-wen Cheng, Zhubei (TW); Jung-Huei Peng, Jhubei (TW); Shang-Ying Tsai, Pingzhen (TW); Hung-Chia Tsai, Taichung (TW); Yi-Chuan Teng, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 72 days.

This patent is subject to a terminal disclaimer.

(21) Appl. No.: 14/585,634

(22) Filed: Dec. 30, 2014

(65) Prior Publication Data

US 2015/0166331 A1 Jun. 18, 2015

Related U.S. Application Data

(63) Continuation of application No. 14/105,253, filed on Dec. 13, 2013, now Pat. No. 8,941,152.

(51) Int. Cl.
| | | |
|---|---|---|
| *H01L 29/84* | (2006.01) | |
| *B81B 7/00* | (2006.01) | |
| *B81B 7/04* | (2006.01) | |
| *B81C 1/00* | (2006.01) | |
| *B81B 7/02* | (2006.01) | |

(52) U.S. Cl.
CPC ............... *B81B 7/007* (2013.01); *B81B 7/02* (2013.01); *B81B 7/04* (2013.01); *B81C 1/0023* (2013.01); *B81C 1/00214* (2013.01); *B81C 1/00333* (2013.01)

(58) Field of Classification Search
CPC ...................................................... H01L 29/84
See application file for complete search history.

(56) References Cited

U.S. PATENT DOCUMENTS

| | | | |
|---|---|---|---|
| 8,941,152 B1 * | 1/2015 | Cheng et al. | 257/254 |
| 2003/0157426 A1 | 8/2003 | Jordan et al. | |
| 2014/0374850 A1 * | 12/2014 | Chen | B81B 7/0029 257/415 |

* cited by examiner

*Primary Examiner* — Marc Armand
(74) *Attorney, Agent, or Firm* — Hauptman Ham, LLP

(57) ABSTRACT

A method of forming a semiconductor device comprises bonding a capping wafer and a base wafer to form a wafer package. The base wafer comprises a plurality of chip package portions. The capping wafer comprises a plurality of isolation trenches. Each isolation trench of the plurality of isolation trenches is configured to substantially align with a corresponding chip package portion of the plurality of chip package portions. The method also comprises separating the wafer package into a plurality of chip packages. Each chip package of the plurality of chip packages comprises at least one chip package portion of the plurality of chip package portions.

18 Claims, 5 Drawing Sheets

SEMICONDUCTOR DEVICE

PRIORITY CLAIM

The present application is a continuation of U.S. application Ser. No. 14/105,253, filed Dec. 13, 2013, which is incorporated herein by reference in its entirety.

BACKGROUND

Device manufacturers are continually challenged to deliver value and convenience to consumers by, for example, providing integrated circuits that provide quality performance. Some integrated circuits include multiple microelectromechanical systems or chip packages formed by different processes. These types of integrated circuits often fail because the chip packages are not formed under common conditions, and/or one chip package's operational performance is unknown compared to another chip package's operational performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. In accordance with one or more embodiments, the figures of the accompanying drawings which are incorporated herein comprise the following.

DETAILED DESCRIPTION

The following disclosure provides many different embodiments, or examples, for implementing different features of the invention. Specific examples of components and arrangements are described below to simplify the present disclosure. These are examples and are not intended to be limiting.

Some semiconductor devices combine multiple chip packages into an integrated circuit. These semiconductor devices often fail because of difficulty in determining whether a chip package is capable of performing an intended operation or the chip package is defective. As such, some devices that are capable of performing an intended operation are joined with defective devices causing the integrated circuit to fail. Using devices that are known to be capable of performing an intended operation reduces the likelihood that a final semiconductor device will be defective. Controlling the source of all of the chip packages used in a semiconductor device increases the likelihood that all of the chip packages used in the semiconductor device are known to be able to perform an intended operation.

Figure 1:
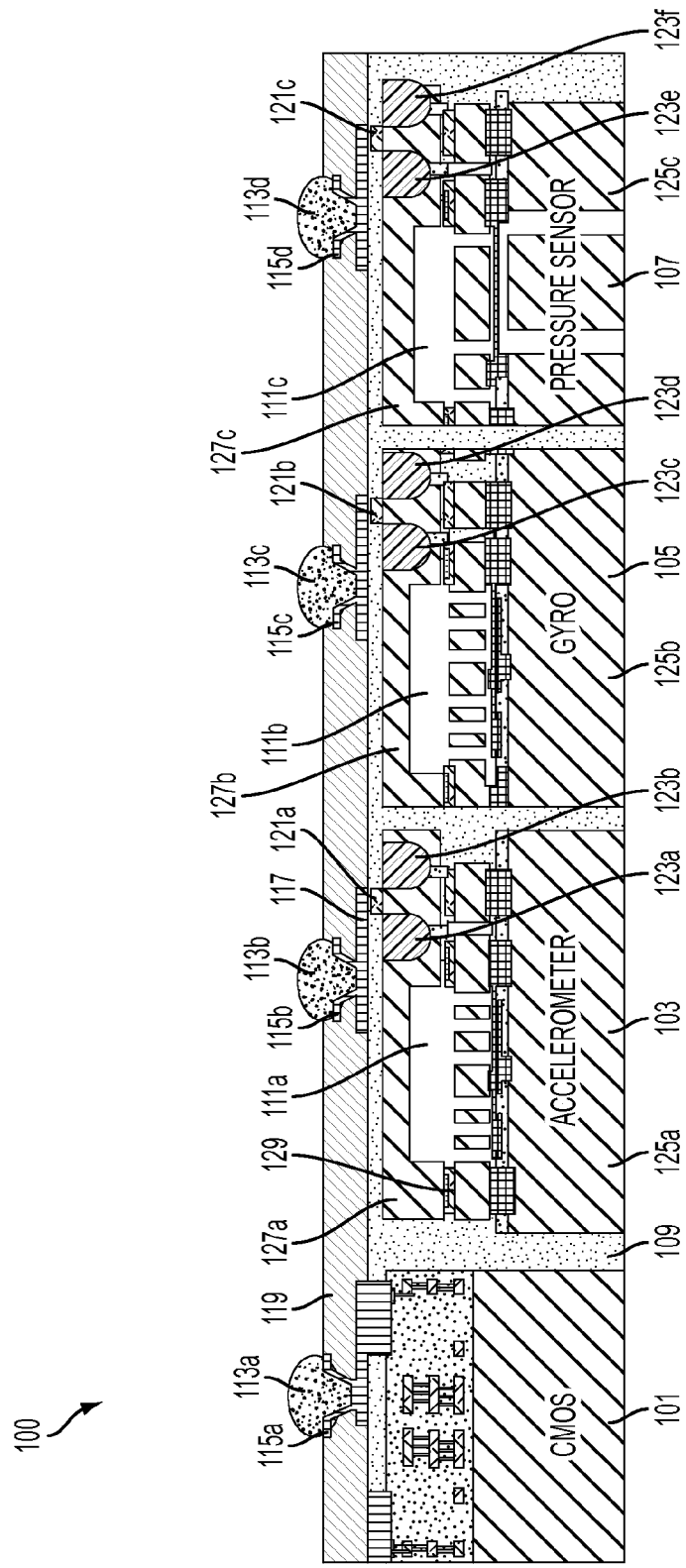
FIG. 1 is a cross sectional view of a semiconductor device, in accordance with one or more embodiments.

FIG. 1 is a cross sectional view of a semiconductor device 100, in accordance with one or more embodiments. The semiconductor device 100 comprises a CMOS chip package 101, a first chip package 103, a second chip package 105, and a third chip package 107 bonded together by a molding compound 109. Each of the first chip package 103, second chip package 105, and third chip package 107 include isolation trenches 111a-111c therein.

The semiconductor device 100 also comprises a plurality of conductive elements 113a-113d that are over and in contact with a series of under bump layers 115a-115c. The under bump layers 115a-115c are over and in contact with a redistribution layer 117. Each of the conductive elements 113 and the under bump layers 115 are formed within a plurality of openings in an insulation layer 119. The insulation layer 119, in some embodiments, comprises an epoxy or low outgassing material. Conductive pads 121a-121c (collectively referred to as conductive pad 121) are over the chip packages 103, 105 and 107 and in contact with a series of pairs of dielectric plugs 123a-123f (collectively referred to as dielectric layer 123).

The first chip package 103, second chip package 105, and third chip package 107 each comprise a chip package portion 125 of a series of corresponding chip package portions 125a-125c (collectively referred to as chip package portion 125) that are each derived from a same base wafer. The first chip package 103, second chip package 105, and third chip package 107 also each comprise a capping wafer portion 127 of a series of corresponding capping wafer portions 127a-127c (collectively referred to as capping wafer portion 127). The capping wafer portions 127a-127c are eutectic bonded by a eutectic bond 129 to the chip package portions 125. The capping wafer portions 127a-127c are each derived from a same capping wafer. In some embodiments, at least one of the conductive pads 121 substantially align with at least one pad or location of eutectic bond 129.

The capping wafer and the base wafer are eutectic bonded before being separated into capping wafer portions 127 and chip package portions 125 by eutectic bond 129 to form a wafer package and then diced to separate the wafer package into the first chip package 103, second chip package 105, and third chip package 107.

In some embodiments, the first chip package 103, second chip package 105 and third chip package 107 are configured to perform specific operations. For example, in some embodiments, the first chip package 103 is an accelerometer, the second chip package 105 is a gyroscope, and the third chip package 107 is a pressure sensor. In some embodiments, the semiconductor device 100 comprises one or more types of chip packages that are one or more of application specific integrated circuits (ASIC), a high vacuum pressure devices (such as devices having 3 ATM pressure), or low vacuum pressure devices.

Figure 2:
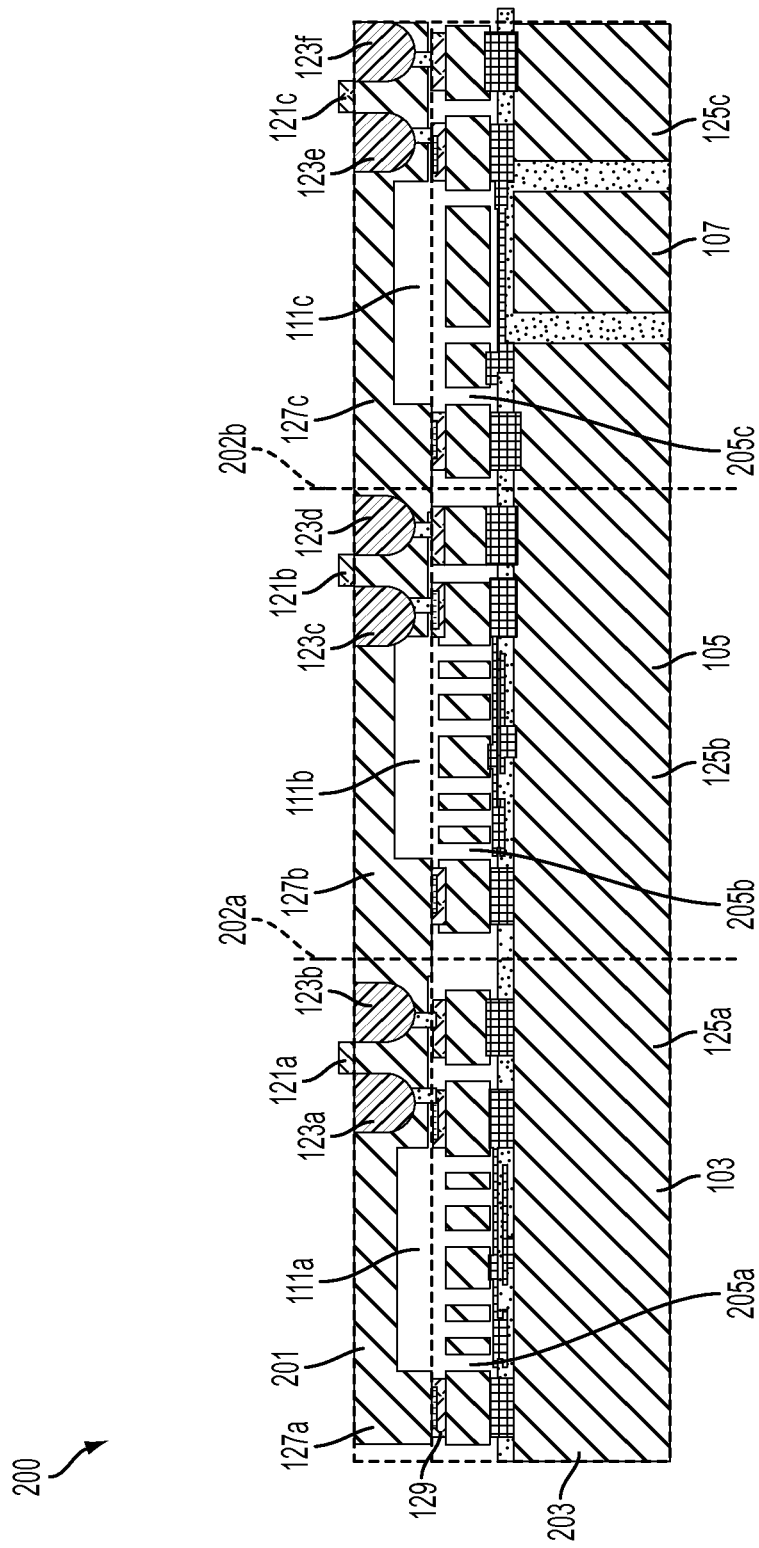
FIG. 2 is a cross sectional view of a wafer package, in accordance with one or more embodiments.

FIG. 2 is a cross sectional view of a wafer package 200, in accordance with one or more embodiments. The wafer package 200 includes a capping wafer 201 eutectic bonded to a base wafer 203. The capping wafer 201 includes capping wafer portions 127 and chip package portions 125 before being separated by a die cutting process along lines 202a and 202b. The eutectic bonds 129 are formed between the capping wafer 201 and the base wafer 203 before the die cutting process. Accordingly, each of the resulting chip packages 103, 105 and 107 are formed from the same capping wafer 201, the same base wafer 203, and are subjected to the same eutectic bonding process that forms eutectic bonds 129.

In some embodiments, the eutectic bonds 129 comprise aluminum, germanium, indium, gold, tin, silicon, tungsten, carbon, other suitable materials, or a combination thereof. In some embodiments, one or more materials that are part of eutectic bonds 129 are deposited on one or more of the capping wafer 201 or the base wafer 203 before the eutectic bonds 129 are formed.

The wafer package 200 comprises the dielectric layer 123 that includes dielectric plugs 123a-123f. The dielectric plugs 123a-123f are formed in openings within the capping wafer 201 after the capping wafer 201 and the base wafer 203 are eutectic bonded or before the capping wafer 201 and the base wafer 203 are eutectic bonded. Additionally, the wafer package 200 includes conductive pads 121a-121c. In some embodiments, the conductive pads 121 comprise aluminum, copper, gold, tin, other suitable materials, or a combination thereof.

The isolation trenches 111a-111c of the capping wafer 201 align with corresponding trenches 205a-205c of the chip package portions 125. The isolation trenches 111a-111c are formed by any process capable of removing material from a substrate such as, but not limited to, an etching process, in the capping wafer 201 before the capping wafer 201 is eutectic bonded to the base wafer 203.

Figure 3:
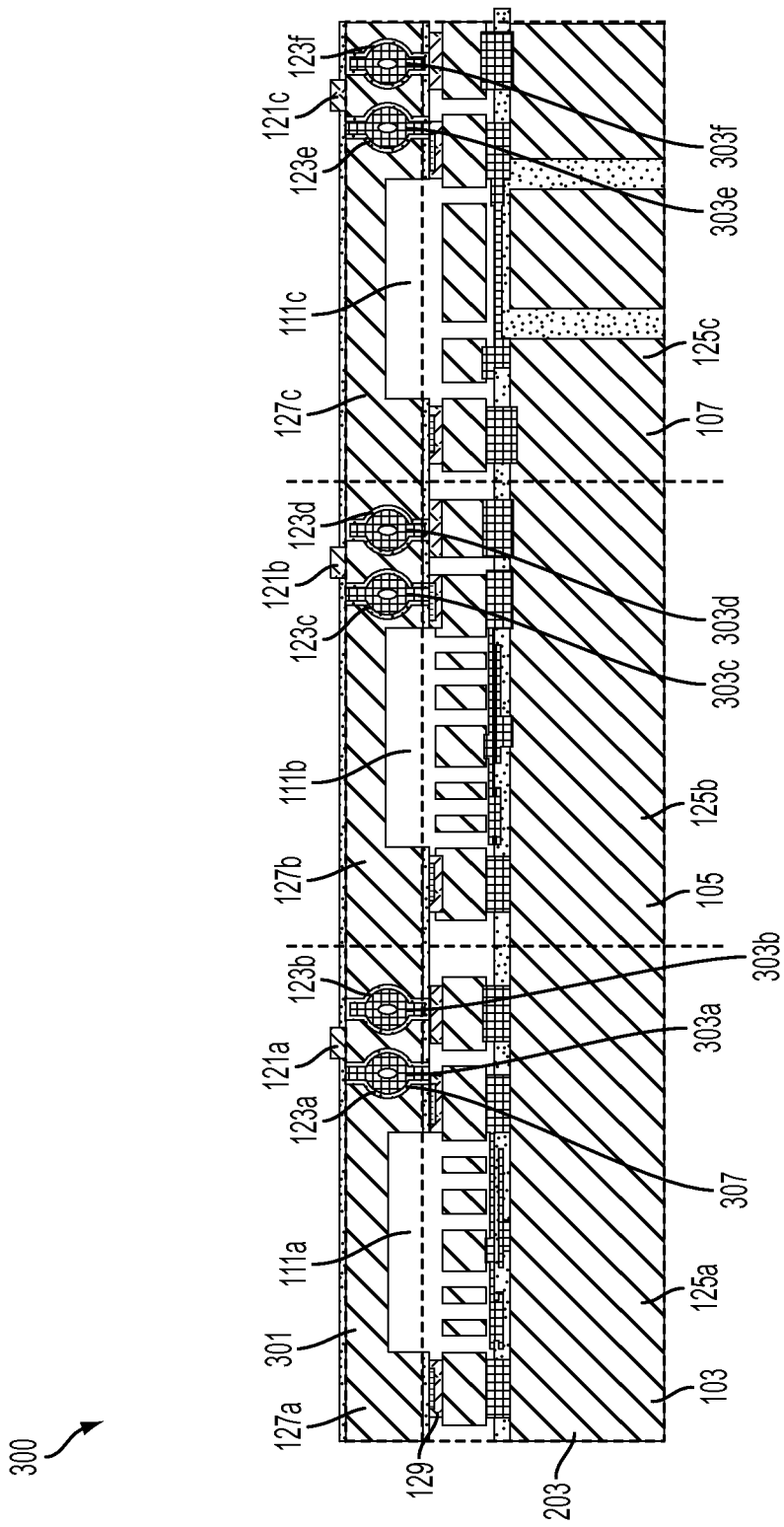
FIG. 3 is a cross sectional view of a wafer package, in accordance with one or more embodiments.

FIG. 3 is a cross sectional view of a wafer package 300, in accordance with one or more embodiments. The wafer package 300 includes many of the features discussed with respect to wafer package 200 illustrated in FIG. 2. The wafer package 300; however, includes a capping wafer 301 that includes dielectric layer 123 that comprises an alternative dielectric layer 123. For example, the dielectric layer 123 is formed in a plurality of openings 303a-303f. The openings 303a-303f are, in some embodiments, formed by an isotropic etching process performed before or after the capping wafer 301 is eutectic bonded to the base wafer 203. The capping wafer 301 is subjected to an oxidation process to form an oxide layer 307 at least covering the sidewalls of the openings 303a-303f and optionally over the capping wafer 301. The openings 303a-303f then have a dielectric material such as, but not limited to, a polysilicon material deposited therein.

Figure 4:
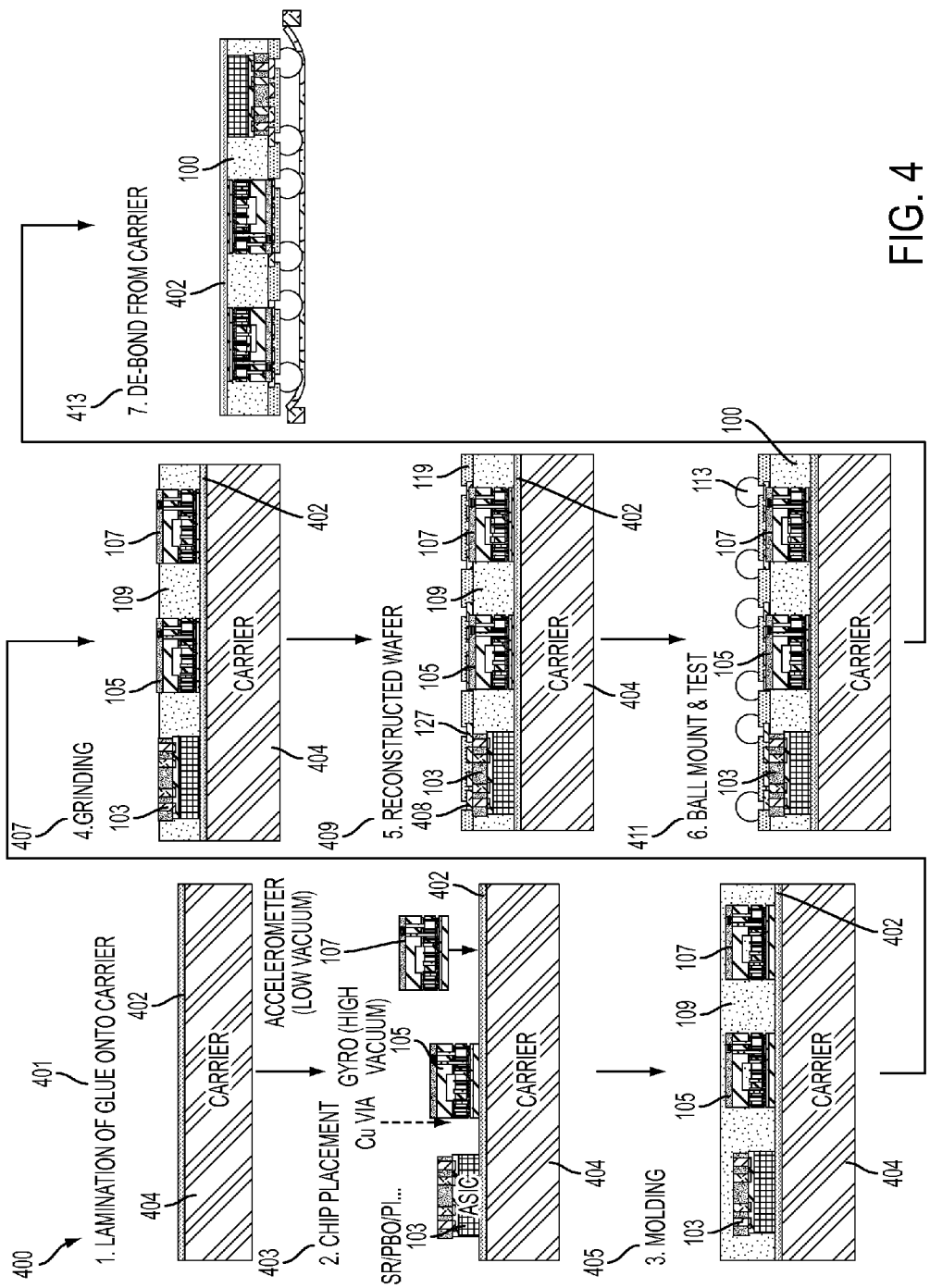
FIG. 4 is a flowchart of a process of making a semiconductor device, in accordance with one or more embodiments.

FIG. 4 is a flowchart of a process 400 for making a semiconductor device such as semiconductor device 100, in accordance with one or more embodiments. The process begins with step 401 in which an adhesive material 402 is placed on a carrier 404. Then, in step 403, chip packages 103, 105 and 107 are placed on the carrier 404. Next, in step 405, the molding compound 109 is deposited over the first chip package 103, the second chip package 105 and the third chip package 107. The molding compound 109 is also cured. In step 407, the molding compound 109 is optionally leveled by, for example, a grinding or CMP process, exposing one or more portions of one or more of the chip package 103, 105, 107.

Then, in step 409, a reconstructed wafer is formed by optionally forming the redistribution layer 117 over the chip packages 103, 105 and 107, and optionally forming the insulation layer 119 over the first chip package 103, the second chip package 105, and the third chip package 107. The insulation layer 119 is optionally cured if the insulation layer 119 comprises a material that requires curing. The insulation layer 119 is also optionally leveled by a grinding or CMP process. A plurality of openings 408 are formed in the insulation layer 119 exposing the redistribution layer 117, for example, by an etching process or other suitable process for removing material.

In step 411, a plurality of conductive elements such as solder balls are deposited in the plurality of openings 408. In some embodiments, the plurality of conductive elements alternatively comprise a plurality of conductive pillars. The semiconductor device 100 is then tested for one or more functions associated with the semiconductor device 100 and/or any operations associated with each of the chip packages 103, 105, or 107. In some embodiments, the under bumper layers 115 are optionally deposited in the openings 408 before depositing the conductive elements in the openings 408. Then, in step 413, the carrier 404 is optionally removed from the semiconductor device 100 by, for example, de-bonding the adhesive 402.

Figure 5:
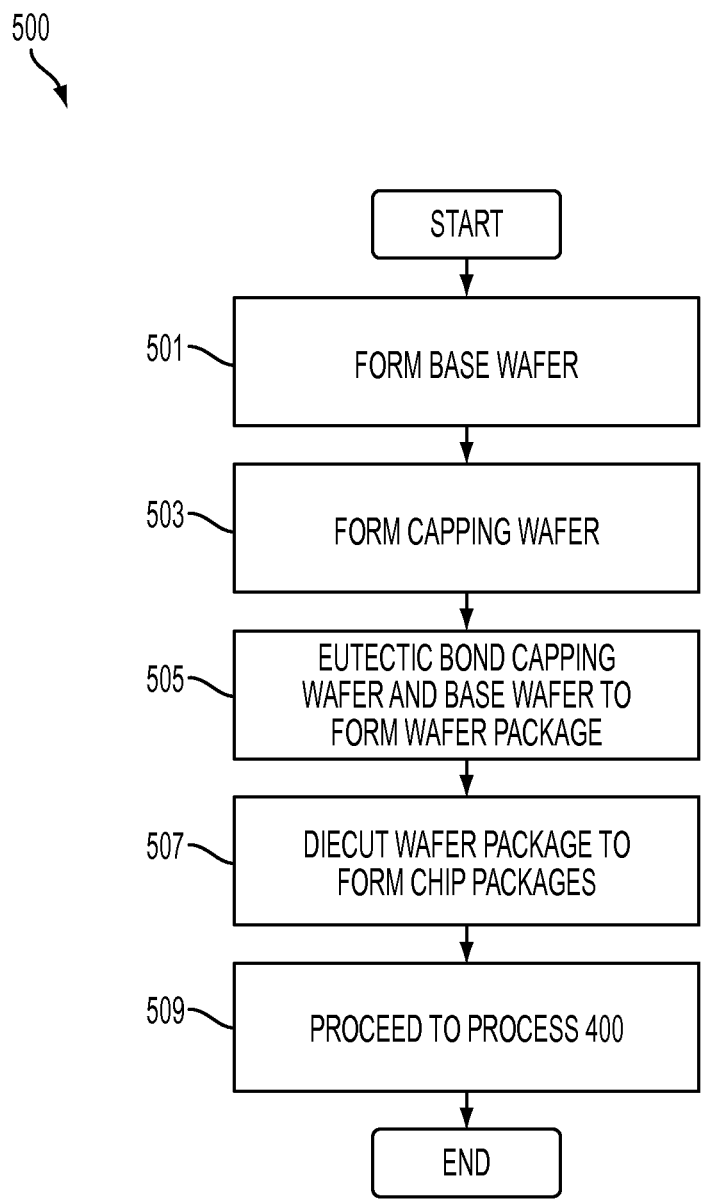
FIG. 5 is a flowchart of a process of making a semiconductor device, in accordance with one or more embodiments.

FIG. 5 is a flow chart of a method 500 of making a semiconductor device 100, in accordance with one or more embodiments. Method 500 begins with step 501 in which a base wafer comprising a first chip package portion, a second chip package portion, and a third chip package portion is formed by a combination of deposition, etching, photolithographic processes, or other suitable process in or on a substrate.

Then, in step 503, a capping wafer is formed comprising a plurality of isolation trenches, each of the plurality of isolation trenches being configured to substantially align with one of the first chip package portion, the second chip package portion or the third chip package portion. The capping wafer is formed by a combination of deposition, etching, photolithographic processes, or other suitable process in or on a substrate.

In some embodiments, a plurality of communication openings are formed in the capping wafer by an etching process, or other suitable process for removing material from one or more layers of the capping wafer. The plurality of communication openings comprise a first pair of communication openings substantially aligned with the first chip package portion, a second pair of communication openings substantially aligned with the second chip package portion, and a third pair of communication openings substantially aligned with the third chip package portion. The openings are filled with a dielectric material forming a dielectric layer, and a plurality of conductive pads are deposited over the dielectric layer.

In some embodiments, the capping wafer is subjected to an oxidization process to form an oxidation layer at least in the plurality of communication openings, and a dielectric material is deposited in the plurality of communication openings. In some embodiments, the plurality of isolation trenches is formed by an etching process, for example, between the pairs of communication openings either before the communication openings are formed, or after.

In step 505, the capping wafer is eutectic bonded to the base wafer to form a wafer package. In some embodiments, the communication openings are formed in the capping wafer before the capping wafer is eutectic bonded to the base wafer. In other embodiments, the communication openings are formed after the capping wafer is eutectic bonded to the base wafer.

In step 507, wafer package is die cut to separate the wafer package into a first chip package configured to perform a first operation, the first chip package comprising the first chip package portion, a second chip package configured to perform a second operation, the second chip package comprising the second chip package portion, and a third chip package configured to perform a third operation, the third chip package comprising the third chip package portion. In some embodiments, the plurality of communication openings are formed in the capping wafer before the wafer package is die cut. In other embodiments, the plurality of communication openings is formed in the capping wafer and any portions thereof after the diecutting process.

In step 509, the process continues to process 400, discussed with respect to FIG. 4. In some embodiments, a CMOS chip package portion is placed on the carrier 404 (FIG. 4) before bonding the first chip package, the second chip package and third chip package. Accordingly, the CMOS chip package, the first chip package, the second chip package and the third chip package are bonded together using the molding compound. Additionally, the redistribution layer 117 (FIG. 1) is also formed over the CMOS chip package.

An aspect of this description relates to a method of forming a semiconductor device comprises bonding a capping wafer and a base wafer to form a wafer package. The base wafer comprises a plurality of chip package portions. The capping wafer comprises a plurality of isolation trenches. Each isolation trench of the plurality of isolation trenches is configured to substantially align with a corresponding chip package portion of the plurality of chip package portions. The method also comprises separating the wafer package into a plurality of chip packages. Each chip package of the plurality of chip packages comprises at least one chip package portion of the plurality of chip package portions.

Another aspect of this description relates to a semiconductor device comprising a plurality of chip packages. Each chip package of the plurality of chip packages comprises a base wafer portion of a base wafer bonded to a capping wafer portion of a capping wafer. The chip packages of the plurality of chip packages are separate components derived from the capping wafer and the base wafer. At least two chip packages of the plurality of chip packages are configured to be handled in different environmental conditions.

A further aspect of this description relates to a method of forming a semiconductor device. The method comprises forming a base wafer comprising a plurality of chip package portions. The method also comprises bonding a capping wafer and the base wafer to form a wafer package. The method further comprises separating the wafer package into a plurality of chip packages. Each chip package of the plurality of chip packages comprises at least one chip package portion of the plurality of chip package portions. The method additionally comprises bonding at least two chip packages of the plurality of chip packages together. The at least two chip packages of the plurality of chip packages are configured to be handled under different pressure conditions.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A method of forming a semiconductor device comprising: bonding a capping wafer and a base wafer to form a wafer package, the base wafer comprising a plurality of chip package portions, the capping wafer comprising a plurality of isolation trenches, and each isolation trench of the plurality of isolation trenches being configured to substantially align with a corresponding chip package portion of the plurality of chip package portions; separating the wafer package into a plurality of chip packages, each chip package of the plurality of chip packages comprising at least one chip package portion of the plurality of chip package portions; forming a plurality of communication openings in the capping wafer, the plurality of communication openings comprising a first pair of communication openings configured to substantially align a first chip package portion of the plurality of chip package portions, and a second pair of communication openings configured to substantially align with a second chip package portion of the plurality of chip package portions; depositing a dielectric material in the plurality of communication openings; and forming the plurality of isolation trenches between the pairs of communication openings.

2. The method of claim 1, wherein at least two chip packages of the plurality of chip packages are configured to be handled in different environmental conditions.

3. The method of claim 1, wherein at least two chip packages of the plurality of chip packages are configured to perform different operations.

4. The method of claim 1, further comprising:
bonding at least two chip packages of the plurality of chip packages together with a molding compound;
forming a redistribution layer over the at least two chip packages of the plurality of chip packages and at least a portion of the molding compound;
forming an insulation layer over the molding compound and the redistribution layer; and
forming a plurality of openings in the insulation layer thereby exposing at least a portion of the redistribution layer.

5. The method of claim 2, wherein a first chip package of the at least two chip packages of the plurality of chip packages is formed as a high vacuum pressure device, and a second chip package of the at least two chip packages of the plurality of chip packages is formed as a low vacuum pressure device.

6. The method of claim 4, wherein a first chip package of the at least two chip packages of the plurality of chip packages is one of an accelerometer or a gyroscope, and a second chip package of the at least two chip packages of the plurality of chip packages is one of an accelerometer, a gyroscope or a pressure sensor, different from the first chip package.

7. The method of claim 4, further comprising:
forming a plurality of under bump layers in the plurality of openings; and
forming a plurality of solder bumps over the under bump layers.

8. The method of claim 4, further comprising:
bonding a CMOS chip package together with the at least two chip packages of the plurality of chip packages using the molding compound.

9. The method of claim 7, wherein the redistribution layer is also formed over the CMOS chip package.

10. A semiconductor device comprising: a plurality of chip packages, each chip package of the plurality of chip packages comprising a base wafer portion of a base wafer bonded to a capping wafer portion of a capping wafer, wherein the chip packages of the plurality of chip packages are separate components derived from the capping wafer and the base wafer, at least two chip packages of the plurality of chip packages are configured to be handled in different environmental conditions; wherein at least two chip packages of the plurality of chip packages are bonded together with a molding compound, and the semiconductor device further comprises: a redistribution layer over the at least two chip packages of the plurality of chip packages and at least a portion of the molding compound; an insulation layer over the molding compound and the redistribution layer; a plurality of openings in the insulation layer exposing a portion of the redistribution layer; and a plurality of conductive elements in the plurality of openings.

11. The semiconductor device of claim 10, wherein a first chip package of the at least two chip packages of the plurality of chip packages is a high vacuum pressure device, and a second chip package of the at least two chip packages of the plurality of chip packages is a low vacuum pressure device.

12. The semiconductor device of claim 10, wherein at least two chip packages of the plurality of chip packages are configured to perform different operations.

13. The semiconductor device of claim 10, wherein the conductive elements comprise an under bump layer and a solder bump.

14. The semiconductor device of claim 10, wherein the conductive elements comprise a conductive pillar.

15. The semiconductor device of claim 10, further comprising: a CMOS chip package bonded together with the at least two chip packages of the plurality of chip packages by the molding compound.

16. The semiconductor device of claim 12, wherein a first chip package of the at least two chip packages of the plurality of chip packages is one of an accelerometer or a gyroscope, and a second chip package of the at least two chip packages of the plurality of chip packages is one of an accelerometer, a gyroscope or a pressure sensor, different from the first chip package.

17. A method of forming a semiconductor device comprising:
   forming a base wafer comprising a plurality of chip package portions;
   bonding a capping wafer and the base wafer to form a wafer package;
   separating the wafer package into a plurality of chip packages, each chip package of the plurality of chip packages comprising at least one chip package portion of the plurality of chip package portions; and
   bonding at least two chip packages of the plurality of chip packages together,
   wherein the at least two chip packages of the plurality of chip packages are configured to be handled under different pressure conditions.

18. The method of claim 17, wherein at least two chip package portions of the plurality of chip package portions are formed having different configurations, causing at least two chip package portions of the plurality of chip package portions to perform different operations.

* * * * *